(12) United States Patent
Kim et al.

(10) Patent No.: US 11,246,228 B2
(45) Date of Patent: Feb. 8, 2022

(54) FOLDABLE DISPLAY DEVICE

(71) Applicant: LG Display Co., Ltd., Seoul (KR)

(72) Inventors: Jun-Hyung Kim, Seoul (KR); Dae-Yun Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/007,514

(22) Filed: Aug. 31, 2020

(65) Prior Publication Data

US 2021/0068276 A1    Mar. 4, 2021

(30) Foreign Application Priority Data

Sep. 4, 2019  (KR) .................. 10-2019-0109598

(51) Int. Cl.
*H05K 5/00*    (2006.01)

(52) U.S. Cl.
CPC .................. *H05K 5/0017* (2013.01)

(58) Field of Classification Search
CPC ............. H05K 5/0017; H01L 51/0097; H01L 2251/5338; G06F 1/1652; G06F 1/1681; G06F 1/1641; G06F 1/1616; G09F 9/301; G02F 1/133305; G02F 1/133308
See application file for complete search history.

(56) References Cited

U.S. PATENT DOCUMENTS

| | | | | |
|---|---|---|---|---|
| 9,983,424 B2* | 5/2018 | Kim | .................. | H01L 51/0097 |
| 10,319,263 B2* | 6/2019 | Lee | .................. | G06F 1/1652 |
| 10,342,121 B2* | 7/2019 | Koo | .................. | H05K 1/0306 |
| 10,485,116 B2* | 11/2019 | Kim | .................. | G06F 1/1641 |
| 10,755,991 B2* | 8/2020 | Park | .................. | B32B 7/022 |
| 10,798,831 B2* | 10/2020 | Shin | .................. | H05K 3/284 |
| 10,930,883 B2* | 2/2021 | Park | .................. | G06F 1/1652 |
| 2012/0204453 A1* | 8/2012 | Jung | .................. | G09F 9/301 40/517 |
| 2015/0043174 A1* | 2/2015 | Han | .................. | G06F 1/1626 361/749 |
| 2018/0150108 A1* | 5/2018 | Song | .................. | G09G 3/34 |
| 2018/0190936 A1* | 7/2018 | Lee | .................. | H01L 51/5237 |
| 2019/0036068 A1* | 1/2019 | Kim | .................. | G06F 1/1641 |
| 2019/0196548 A1* | 6/2019 | Kim | .................. | G06F 1/1681 |
| 2019/0207141 A1* | 7/2019 | Kim | .................. | H01L 51/524 |
| 2020/0319672 A1* | 10/2020 | Kim | .................. | G06F 1/1637 |
| 2021/0007229 A1* | 1/2021 | Gu | .................. | G09F 9/301 |
| 2021/0066626 A1* | 3/2021 | Park | .................. | G06F 1/1652 |

FOREIGN PATENT DOCUMENTS

KR    10-2018-0062272 A    6/2018

* cited by examiner

*Primary Examiner* — Abhishek M Rathod
(74) *Attorney, Agent, or Firm* — Morgan, Lewis & Bockius LLP

(57) ABSTRACT

A foldable display device includes a display panel, a mid-frame arranged on a rear surface of the display panel, including a folding region and unfolding regions formed at both sides of the folding region, and configured to have a perforated pattern formed in the folding region, a first adhesive layer and a second adhesive layer arranged in the respective unfolding regions on a rear surface of the mid-frame, and an insert arranged corresponding to the folding region on the rear surface of the mid-frame.

13 Claims, 12 Drawing Sheets

FOLDABLE DISPLAY DEVICE

This application claims the benefit of Korean Patent Application No. 10-2019-0109598, filed on Sep. 4, 2019, which is hereby incorporated by reference as if fully set forth herein.

BACKGROUND

Technical Field

The present disclosure relates to a foldable display device which can be used by folding or unfolding a display panel.

Discussion of the Related Art

As display devices which display images, there are various kinds of display devices, such as a liquid crystal display (LCD), a plasma display panel (PDP), an organic light emitting diode (OLED) display and an electrophoretic display (EPD).

Recently, research on a foldable display device, which is bendable and stretchable or foldable and unfoldable and is thus used in various applications, is underway.

The foldable display device may be implemented by connecting flat display panels, or be implemented using a display panel having flexibility, i.e., a flexible display panel. The flexible display device means a display device to which a display panel configured to be warped, bent, folded or rolled like paper is applied while maintaining display characteristics of the conventional flat display device.

In order to implement the foldable display device, a flexible display panel and a housing which maintains a predetermined shape or a folded angle of the flexible display panel are required. Further, in order to use the foldable display device which may maintain the predetermined shape or the folded angle using the flexible display panel, a hinge unit, about which the housing is rotated, corresponding to a folding region of the display panel, is required. Here, in general, the housing includes planar plates provided at both sides of the hinge unit, and is rotated about the hinge unit serving as an axis of rotation, thereby achieving the folding function of the foldable display device.

SUMMARY

Accordingly, embodiments of the present invention are directed to a foldable display device that substantially obviates one or more problems due to limitations and disadvantages of the related art.

An aspect of the present disclosure is to provide a foldable display device in which an insert is provided so as to eliminate a vacant space in a folding region of the rear surface of a display panel, and may thus prevent the display panel from being vulnerable to impact due to the vacant space and prevent occurrence of a sense of difference in touch between the folding region and unfolding regions when the display panel is touched.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, as embodied and broadly described herein, a foldable display device includes a display panel, a mid-frame arranged on a rear surface of the display panel, including at least one folding region and unfolding regions formed at both sides of the folding region, a first adhesive layer and a second adhesive layer arranged in the respective unfolding regions on a rear surface of the mid-frame, and an insert arranged corresponding to the folding region on the rear surface of the mid-frame.

The mid-frame may include a first plate configured to have a perforated pattern formed therethrough in the folding region, a third adhesive layer arranged on an upper surface of the first plate, and a second plate arranged on an upper surface of the third adhesive layer.

The insert may be arranged between the first adhesive layer and the second adhesive layer.

The insert may be formed to have a thickness corresponding to a thickness of the first adhesive layer and/or the second adhesive layer.

The insert may be formed of an elastic material so as to be elastically stretched during a process of folding the mid-frame.

The insert may include first insertion members arranged on rear surfaces of the first adhesive layer and the second adhesive layer, and second insertion members arranged between the first adhesive layer and the second adhesive layer on the first insertion members.

The insert may further include third insertion members arranged on the second insertion members so as to be inserted into the perforated pattern.

The first plate may include connection frames configured to connect respective holes of the perforated pattern to adjacent holes, and cross-sections of the third insertion members and the connection frames have a trapezoidal shape or a triangular or higher-order polygonal shape.

The third insertion members may extend up to a rear surface of the third adhesive layer.

The insert may be divided into two parts by a folding axis.

The foldable display device may further include a back cover arranged to surround side and rear surfaces of the foldable display device, coupled to rear surfaces of the first adhesive layer and the second adhesive layer or a rear surface of the insert, and divided into two parts so as to be folded in the folding region.

The third adhesive layer may be arranged only in the unfolding regions between the first plate and the second plate.

The third adhesive layer may be arranged between the first plate and the second plate, such that the third adhesive layer is adhered to both the first plate and the second plate in the unfolding regions and is adhered to any one of the first plate and the second plate in the folding region.

It is to be understood that both the foregoing general description and the following detailed description of the present invention are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principle of the disclosure. In the drawings.

DETAILED DESCRIPTION

Figure 1:
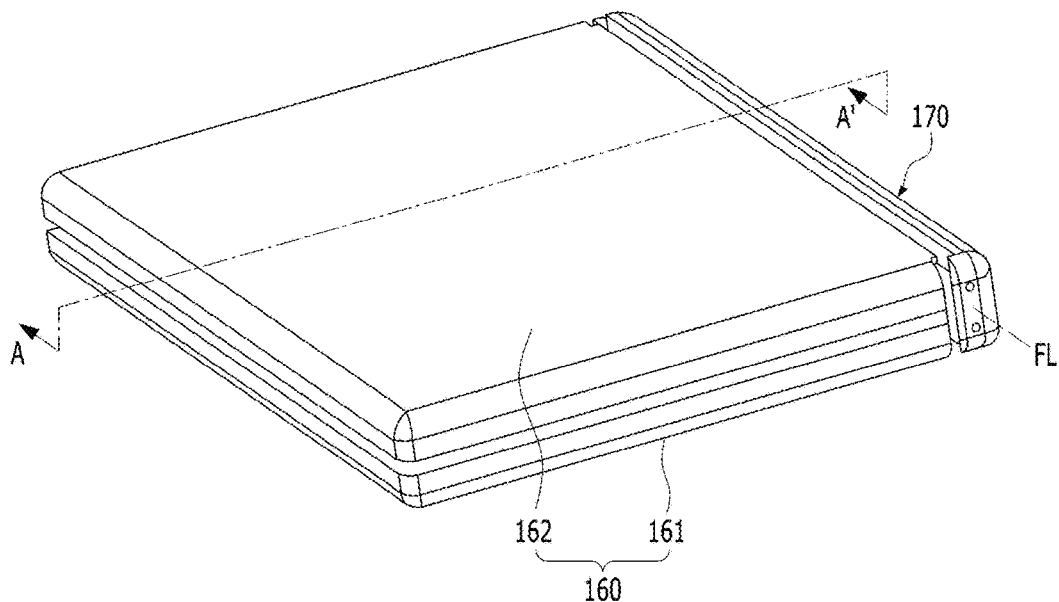
FIG. 1 is a perspective view illustrating a foldable display device according to one embodiment of the present invention in a folded state.

Reference will now be made in detail to embodiments of the present disclosure, examples of which are illustrated in the accompanying drawings. In the following description of the embodiments and the drawings, the same or similar elements are denoted by the same reference numerals even when they are depicted in different drawings. In the following description of the embodiments of the present invention, a detailed description of known functions and configurations incorporated herein will be omitted when it may make the subject matter of the present invention rather unclear. In addition, those skilled in the art will appreciate that some features shown in the drawings can be exaggerated, reduced or simplified for ease of illustration, and the drawings and elements shown in the drawings are not necessarily illustrated at an appropriate scale.

In the present invention, "display devices" may include, in a narrow sense, display devices, each of which includes a display panel and a driving unit to drive the display panel, such as a liquid crystal module (LCM) and an organic light emitting diode (OLED) module. Further, "display devices" may include complete products (i.e., finished products) including an LCM, an OLED module and a QD module, such as a notebook computer, a TV, a computer monitor and an automotive display, other equipment display devices for vehicles, and set electronic devices or set devices, such as a mobile electronic apparatus, i.e., a smartphone or an electronic pad.

Figure 2:
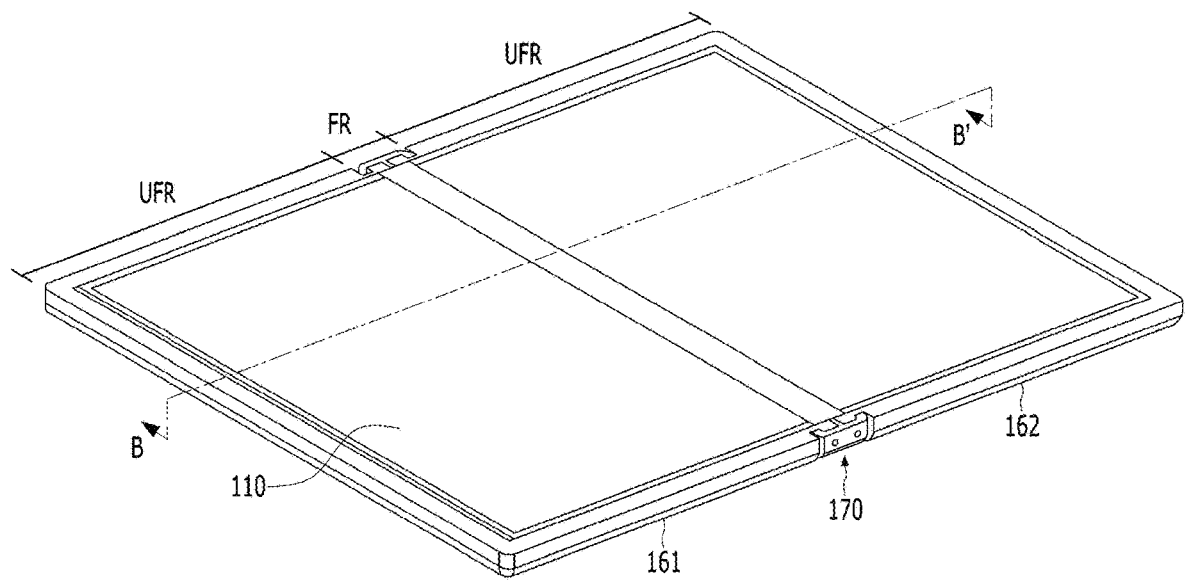
FIG. 2 is a perspective view of the foldable display device shown in FIG. 1 in an unfolded state.
Figure 3:
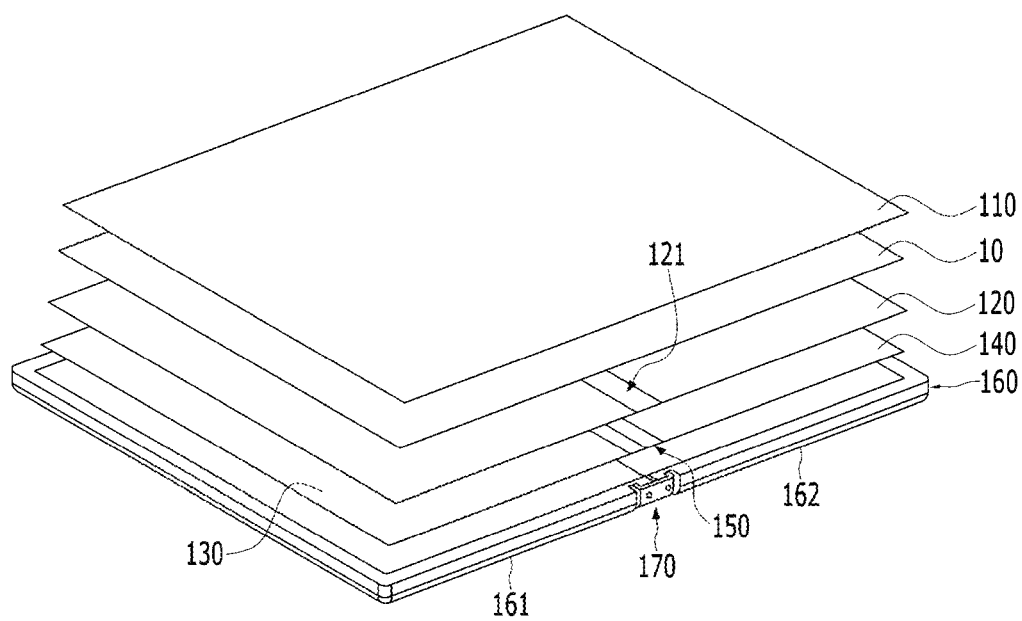
FIG. 3 is an exploded perspective view of the foldable display device shown in FIG. 2.

FIG. 1 is a perspective view illustrating a foldable display device according to one embodiment of the present invention in a folded state, FIG. 2 is a perspective view the foldable display device shown in FIG. 1 in an unfolded state, and FIG. 3 is an exploded perspective view of the foldable display device shown in FIG. 2.

Referring to FIGS. 1 to 3, a foldable display device 100 according to one embodiment of the present invention includes a display panel 110 which displays an image, a mid-frame 120 which is arranged on the rear surface of the display panel 110, a first adhesive layer 130, a second adhesive layer 140, an insert 150, and a back cover 160.

First, the display panel 110 is foldable in a folding region. Substantially, when the display panel 110 is folded, the display panel 110 is not folded accurately at any angle on a predetermined folding line, and the folding region is folded by stages or sequentially with a predetermined curvature and thus the folding line is formed as a constant area. The folding line FL indicated by a dotted line in the drawings is the center of an area which is folded with the predetermined curvature by folding the foldable display device 100 and expressed as a virtual line. Of course, together with the display panel 110, the mid-frame 120 and the back cover 160 are also folded about the same folding line.

The display panel 110 may be a flexible display panel which may be warped or bent, or a flat display panel which is rigid so as not to be easily deformed by external force.

A flexible display panel used as the display panel 110 may implement an organic light emitting diode (OLED) display, an electrophoretic display (EPD) or an electrochromic display (ECD).

In order to form the foldable display panel 110 using flat display panels, a plurality of flat display panels may be physically connected to be foldable, or an area, which may be flexibly folded, may be separately formed in a single flat display panel. Here, the flat display panel may include a liquid crystal display (LCD) panel or a plasma display panel (PDP). In the foldable display panel 110 in which the flat display panels are physically connected to be foldable, a separated circuit unit may be connected to each of the respective flat display panels.

For example, when a liquid crystal display panel is used as the display panel 110, the display panel 110 includes a plurality of gate lines, a plurality of data lines, and pixels formed at intersections between the gate lines and the data lines. Further, the display panel 110 may include an array substrate including thin film transistors which are switching elements for respectively adjusting light transmittance in the pixels, an upper substrate having a color filter and/or a black matrix, and a liquid crystal layer formed between the array substrate and the upper substrate.

Alternatively, when an OLED display panel is used as the display panel 110, the display panel 110 includes a plurality of gate lines, a plurality of data lines, and pixels formed at intersections between the gate lines and the data lines. Further, the display panel 110 may include an array substrate including thin film transistors which are elements for selectively applying voltage to the respective pixels, an organic light emitting diode (OLED) layer formed on the array substrate, and an encapsulation substrate arranged on the array substrate so as to cover the OLED layer. The encapsulation substrate may protect the thin film transistors and the OLED layer from external impact, and prevent moisture or oxygen from permeating into the OLED layer.

A layer formed on the array substrate may include an inorganic light emitting layer, for example, a nano-sized material layer or quantum dots.

Hereinafter, an organic light emitting diode (OLED) display panel used as the display panel 110 will be exemplarily described. However, the display panel 110 is not limited thereto. For example, a quantum-dot light emitting diode (QLED) display panel or an inorganic light emitting diode display panel among electroluminescent display panels may be used as the display panel 110.

The display panel 110 may include a display area which displays a screen, and a non-display area which is located adjacent to the display area. For example, the display panel 110 may include the display area which displays the screen, and the non-display area which is arranged so as to surround the display area.

A touch film (not shown) may be provided on the upper surface of the display panel 110, the touch film may be adhered to the display panel 110 by an adhesive layer, and an adhesive, such as an optically clear adhesive (OCA), may be applied to the adhesive layer. Further, a cover window, a protective film and an optical sheet may be additionally provided on the upper surface of the touch film. For example, the cover window may be formed of plastic having flexibility, such as polyimide (PI), polyethylene terephthalate (PET), polyethylene naphthalate (PEN), polycarbonate (PC), polyethersulfone (PES), polyarylate (PAR), polysulfone (PSF) or cyclic-olefin copolymer (COC).

Referring to FIG. 3, an adhesive layer 10 is arranged on the rear surface of the display panel 110, the mid-frame 120 is arranged on the rear surface of the adhesive layer 10, the insert 150 is arranged corresponding to a folding region FR and the first and second adhesive layers 130 and 140 are arranged corresponding to unfolding regions UFR on the rear surface of the mid-frame 120. The back cover 160 may be coupled to the rear surface of the mid-frame 120 by the first and second adhesive layers 130 and 140.

The first adhesive layer 130 is provided in one unfolding region UFR and the second adhesive layer 140 is provided in the other unfolding region UFR on the rear surface of the mid-frame 120. The back cover 160 is coupled to cover at least side and rear surfaces of the foldable display device 100.

Figure 4:
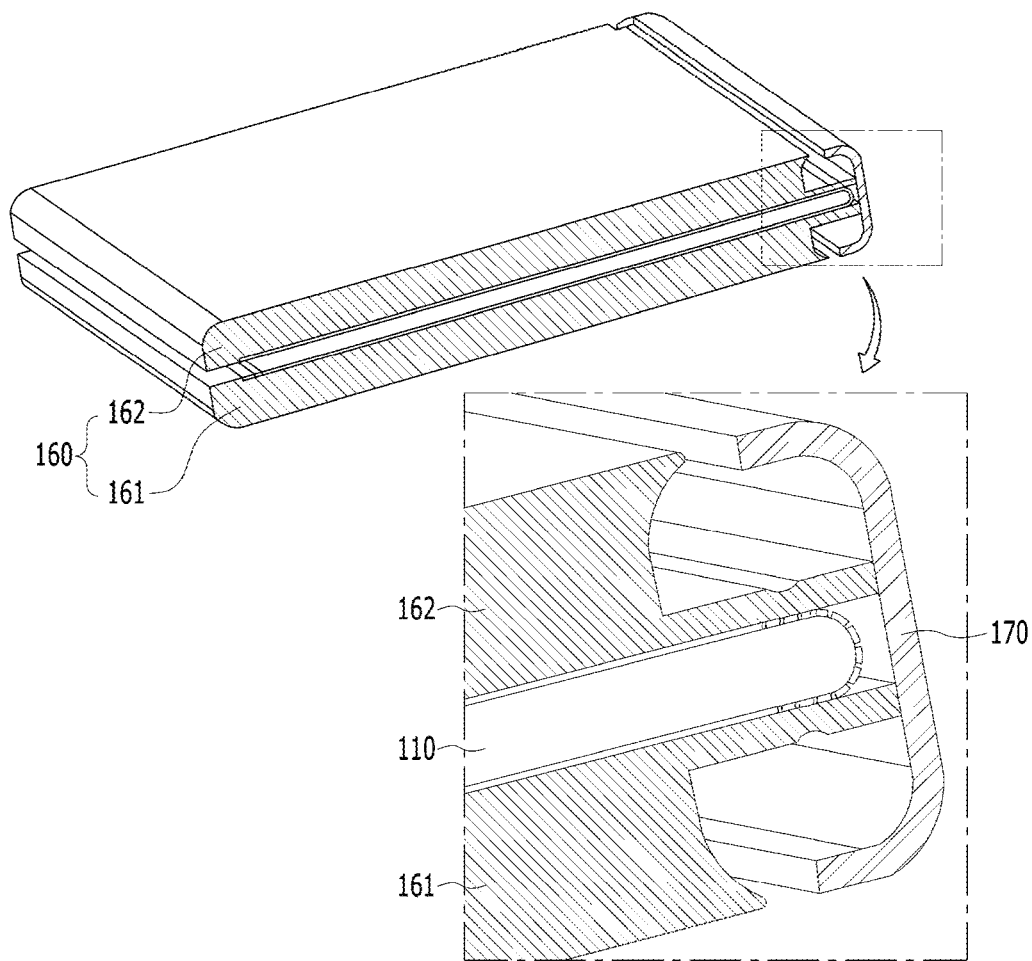
FIG. 4 is a cross-sectional view of the foldable display device shown in FIG. 1, taken along line A-A'.
Figure 5:
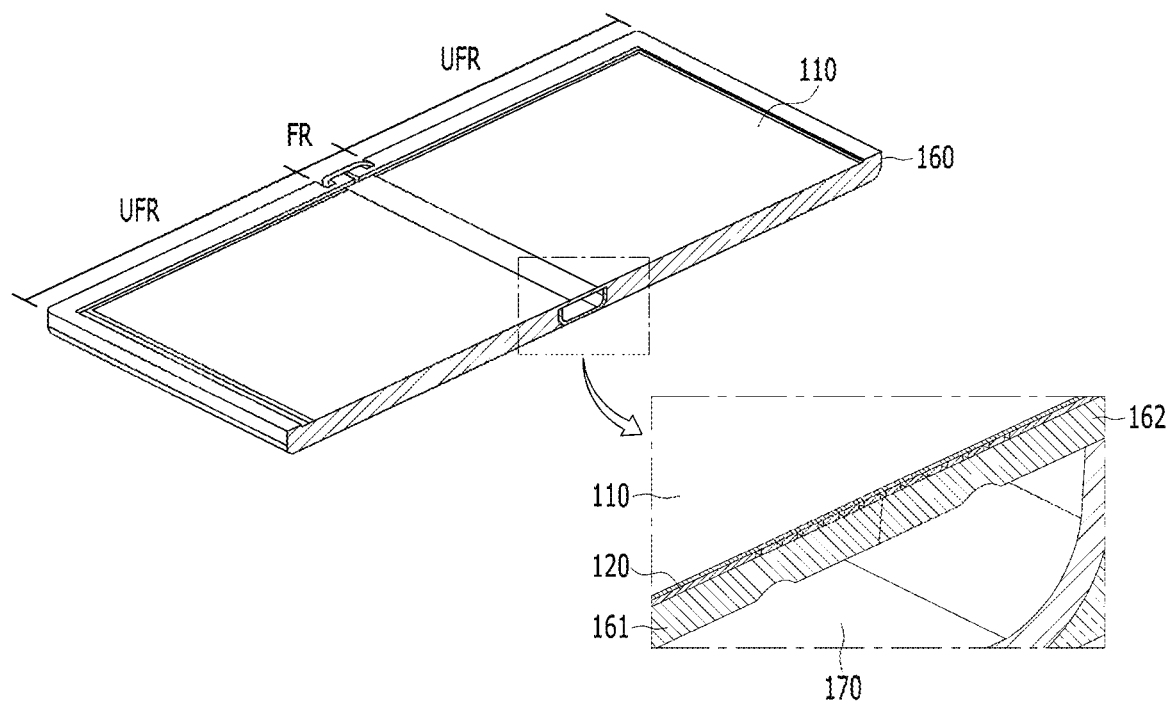
FIG. 5 is a cross-sectional view of the foldable display device shown in FIG. 2, taken along line B-B'.

FIG. 4 is a cross-sectional view of the foldable display device shown in FIG. 1, taken along line A-A', and FIG. 5 is a cross-sectional view of the foldable display device shown in FIG. 2, taken along line B-B'.

Referring to FIGS. 4 and 5, the foldable display device 100 includes a hinge unit 170 about which the back cover 160 is folded in the folding region FR. The hinge unit 170 may couple corresponding ends of left and right back cover parts 161 and 162 of the back cover 160 to each other so as to be rotatable, and cover the folding region FR so as not to be exposed to the outside in the folded state of the back cover 160.

Figure 6A:
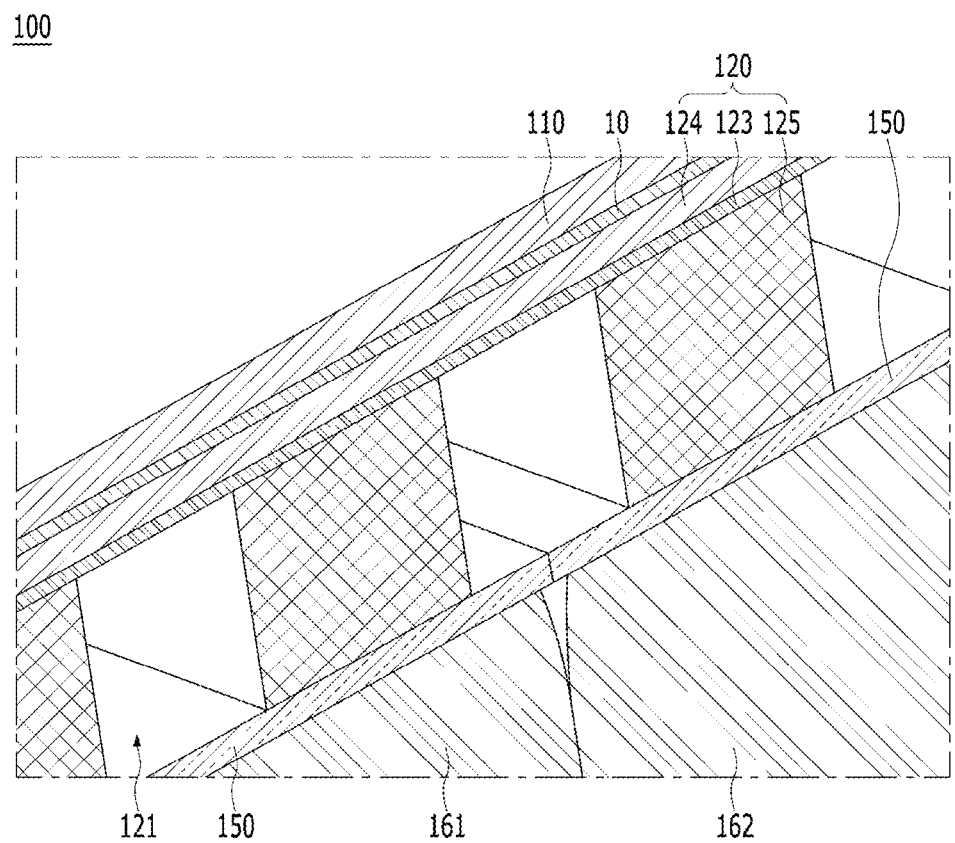
FIG. 6A is a perspective view illustrating one embodiment of an insert in a folding region of the foldable display device shown in FIG. 5.
Figure 6B:
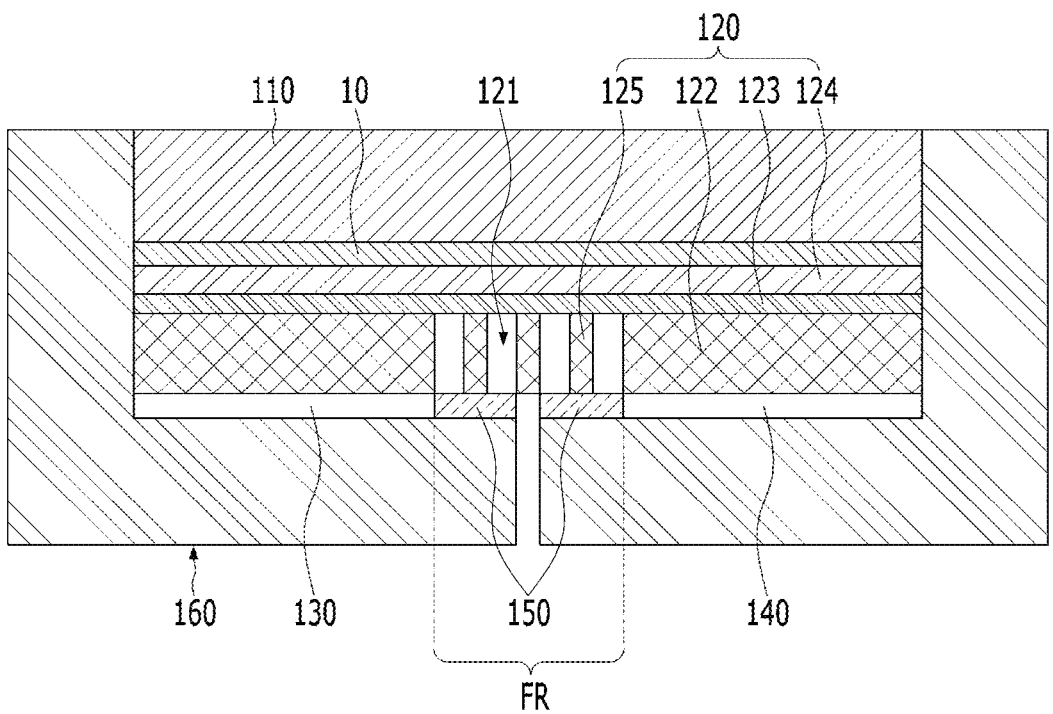
FIG. 6B is a cross-sectional view of the foldable display device shown in FIG. 6A.
Figure 6C:
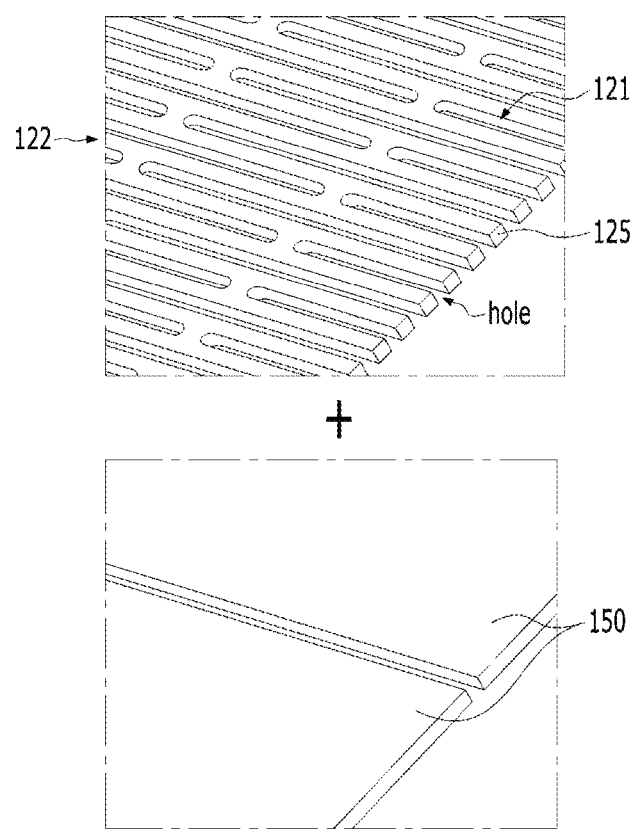
FIG. 6C is a partially enlarged view illustrating the insert shown in FIG. 6A.
Figure 6D:
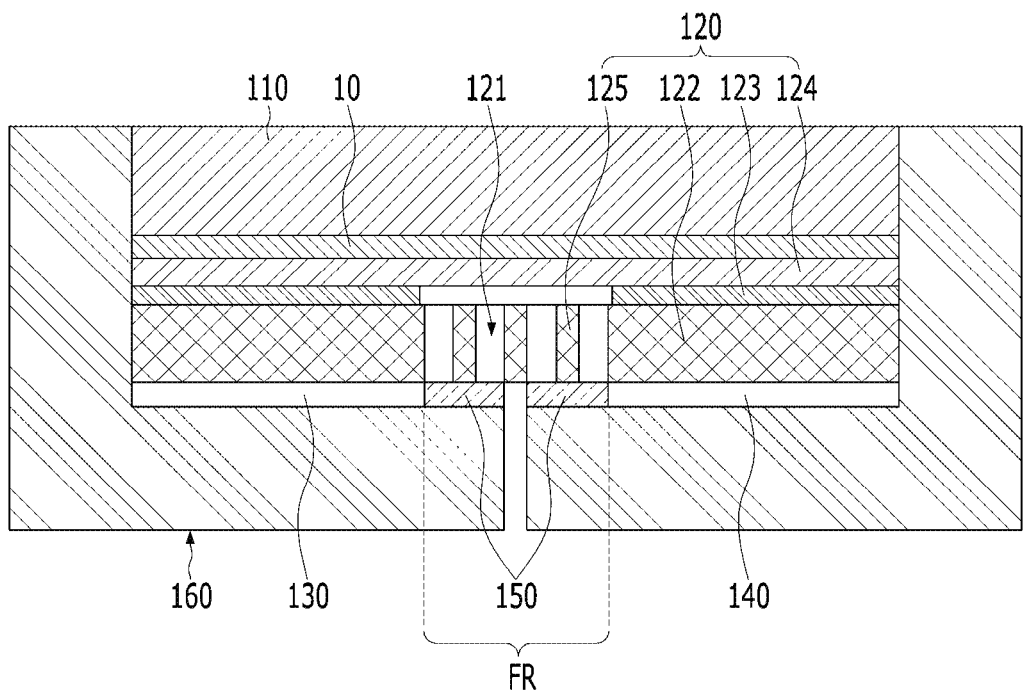
FIG. 6D is a cross-sectional view of another embodiment of a third adhesive layer shown in FIG. 6A.

FIG. 6A is a perspective view illustrating one embodiment of the insert in the folding region of the foldable display device shown in FIG. 5, FIG. 6B is a cross-sectional view of the foldable display device shown in FIG. 6A, FIG. 6C is a partially enlarged view illustrating the insert shown in FIG. 6A, and FIG. 6D is a cross-sectional view of another embodiment of a third adhesive layer shown in FIG. 6A.

Referring to FIGS. 6A to 6C, in the foldable display device 100 according to one embodiment of the present invention, the mid-frame 120 is adhered to the rear surface of the display panel 110 by the adhesive layer 10, and the insert 150 is arranged corresponding to the folding region FR on the rear surface of the mid-frame 120.

Firstly, the mid-frame 120 includes a first plate 122 having a perforated pattern 121 formed therethrough in the folding region FR, a third adhesive layer 123 provided on the upper surface of the first plate 122, and a second plate 124 adhered to the upper surface of the third adhesive layer 123.

The first plate 122 may be formed of metal. The perforated pattern 121 in the folding region FR of the first plate 122 has connection frames 125 configured to connect respective holes of the perforated pattern 121 to adjacent holes. In the process of folding or unfolding the foldable display device 100, the shape and the size of the holes of the perforated pattern 121 may be deformed. At this time, during the process of unfolding the foldable display device 100, the connection frames 125 may provide elasticity so that the holes of the perforated pattern 121 are restored to their original shape or size. For example, the first plate 122 may be formed of a material having greater stiffness so as to have a greater thickness than the second plate 124.

The third adhesive layer 123 may be arranged only in the unfolding regions UFR between the first plate 122 and the second plate 124, or be arranged in the unfolding regions UFR and be adhered to only any one of the first plate 122 and the second plate 124 in the folding region FR. This third adhesive layer 123 may prevent the perforated pattern 121 of the first plate 122 from being transferred to the surface of the display panel 110 when the folding region FR is folded and unfolded repeatedly.

The second plate 124 may prevent units located on the rear surface of the display panel 110 or the perforated pattern 121 of the mid-frame 120 from being visible. The second plate 124 may be formed as a thin shade formed of metal. Further, the second plate 124 may reduce friction occurring between the display panel 110 and the mid-frame 120 in the process of folding or unfolding the foldable display device 100, and prevent damage thereby.

Referring to FIG. 6B, in the mid-frame 120, the first adhesive layer 130 is arranged on one side of the rear surface of the first plate 122 corresponding to one unfolding region UFR, and the second adhesive layer 140 is arranged on the other side of the rear surface of the first plate 122 corresponding to the remaining unfolding region UFR. The back cover 160 is adhered to the rear surfaces of the first adhesive layer 130 and the second adhesive layer 140. That is, the first adhesive layer 130 and the second adhesive layer 140 are adhered between the rear surface of the first plate 122 in the unfolding regions UFR and the back cover 160.

Here, the insert 150 may be provided in the folding region FR on the rear surface of the mid-frame 120. The insert 150 may be formed of a synthetic plastic or rubber-based elastic (soft) material. The insert 150 may be elastically stretched in the process of folding the foldable display device 100. The insert 150 prevents formation of a gap between the rear surface of the mid-frame 120 and the back cover 160. The insert 150 may be adhered to the inner surface of the back cover 160 corresponding to the folding region FR, and be divided into two parts so that these parts may be separated from each other during the folding process of the back cover 160. The insert 150 may be formed to have the same thickness as the first adhesive layer 130 and the second adhesive layer 140.

Therefore, the insert 150 may prevent occurrence of a sense of difference in touch between the folding region FR and the unfolding regions UFR when the display panel 110 is touched. Further, the insert 150 may absorb impact applied to the folding region FR. That is, in a conventional structure provided with no insert, a display panel absorbs a portion of touch force occurring in a folding region FR and is pushed towards a back cover, and thus there is a sense of difference in touch force between the folding region and the unfolding regions. On the other hand, in the present invention, the insert 150 provided in the folding region FR prevents the display panel 110 from being pushed toward the back cover 160, thereby being absorbing impact and preventing occurrence of a sense of difference in touch between the folding region FR and the unfolding regions UFR.

Further, referring to FIG. 6D, the third adhesive layer 123 may be arranged in the unfolding regions UFR except for the folding region FR between the first plate 122 and the second plate 124. That is, a region of the third adhesive layer 123 corresponding to the folding region FR between the first plate 122 and the second plate 124 is deleted. By deleting the third adhesive layer 123 from the folding region FR, the first plate 122 may not pull the second plate 124 via the third adhesive layer 123 during the folding process, and thus, in the unfolded state of the display panel 110 after folding, transfer of the shape of the perforated pattern 121 onto the display panel 110 may be prevented.

Figure 7A:
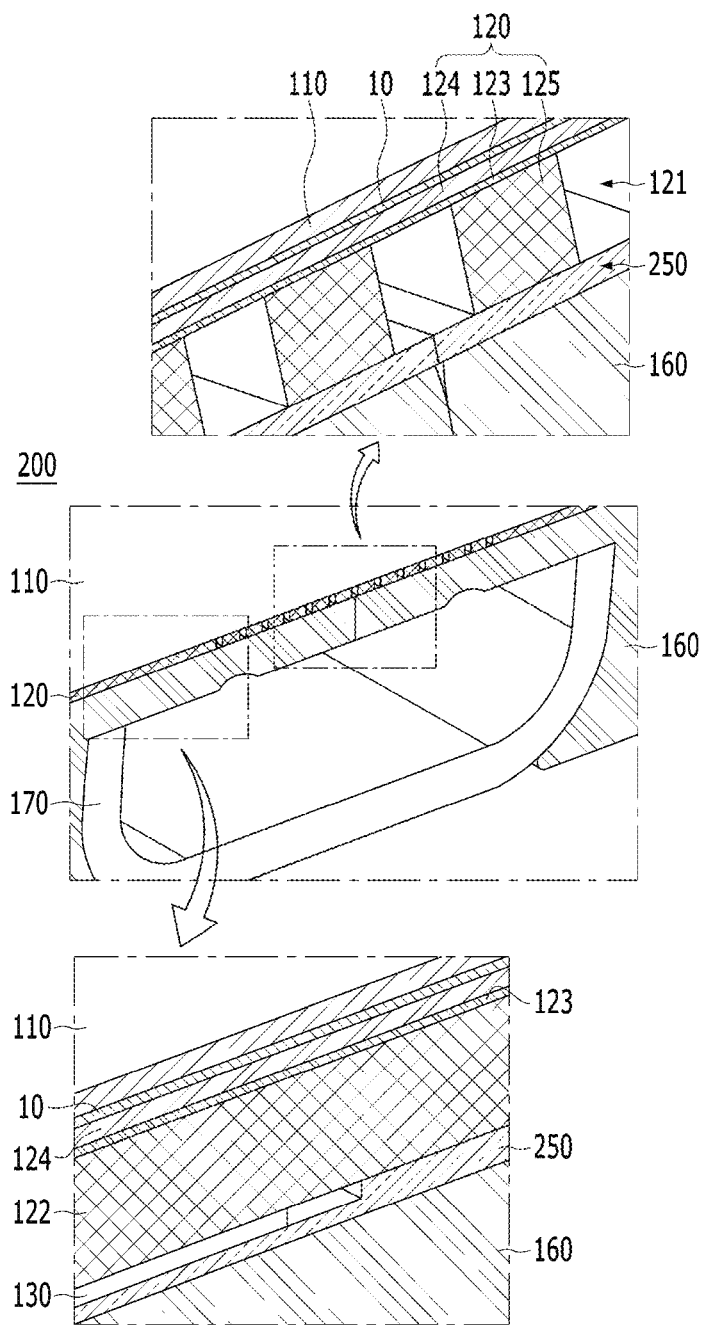
FIG. 7A is a perspective view illustrating another embodiment of the insert in the folding region of the foldable display device shown in FIG. 5.
Figure 7B:
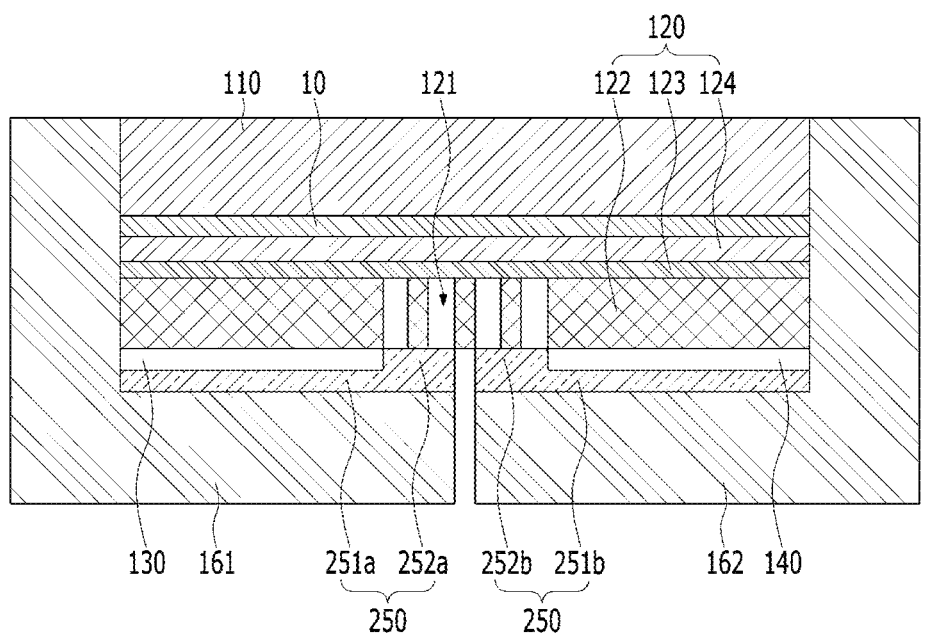
FIG. 7B is a cross-sectional view of the foldable display device shown in FIG. 7A.

FIG. 7A is a perspective view illustrating another embodiment of the insert in the folding region of the foldable display device shown in FIG. 5, and FIG. 7B is a cross-sectional view of the foldable display device shown in FIG. 7A. Hereinafter, some parts in this embodiment which are substantially the same as those in the former embodiment are denoted by the same reference numerals even though they are depicted in different drawings.

Referring to FIGS. 7A and 7B, in a foldable display device 200 according to another embodiment of the present invention, a mid-frame 120 is adhered to the rear surface of a display panel 110 by an adhesive layer 10, and an insert 250 is arranged on the rear surface of the mid-frame 120.

Here, in the mid-frame 120, a first adhesive layer 130 is arranged on one side of the rear surface of a first plate 122 corresponding to one unfolding region UFR, and a second adhesive layer 140 is arranged on the other side of the rear surface of the first plate 122 corresponding to the remaining unfolding region UFR.

The insert 250 includes a first left insertion member 251a and a first right insertion member 251b respectively arranged on the rear surfaces of the first adhesive layer 130 and the second adhesive layer 140, and a second left insertion member 252a and a second right insertion member 252b respectively arranged between the first adhesive layer 130 and the second adhesive layer 140 on the first left insertion member 251a and the first right insertion member 251b.

Although FIG. 7B illustrates that the first left insertion member 251a and the second left insertion member 252a are formed in an integrated structure and the first right insertion member 251b and the second right insertion member 252b are formed in an integrated structure, a separated structure may be applied to the first and second left insertion members 251a and 252a and the first and second right insertion members 251b and 252b. For example, in the integrated structure, the first left insertion member 251a and the second left insertion member 252a may be integrally formed, and the first right insertion member 251b and the second right insertion member 252b may be integrally formed and be simultaneously coupled to left and right back cover parts 161 and 162 of a back cover 160, which are provided at both sides, and in the separated structure, the first left insertion member 251a may be coupled to the upper surface of the left back cover part 161 and the first right insertion member 251b may be coupled to the upper surface of the right back cover part 162 and then the second left insertion member 252a may be coupled to the upper surface of the first left insertion member 251a and the second right insertion member 252b may be coupled to the upper surface of the first right insertion member 251b.

In the process of folding the back cover 160 (161, 162), the first and second left insertion members 251a and 252a located at the left side of the folding region FR and the first and second right insertion members 251b and 252b located at the right side of the folding region FR may be separated from each other.

Further, the first left insertion member 251a may be arranged to cover the entire area or some area between the first adhesive layer 130 and the left back cover part 161, and the first right insertion member 251b may be arranged to cover the entire area or some area between the second adhesive layer 140 and the right back cover part 162. That is, although FIG. 7B illustrates that the first left insertion member 251a and the first right insertion member 251b are arranged throughout the entire area between the back cover 160 (161, 162) and the adhesive layers 130 and 140 (in the unfolding regions UFR shown in FIG. 2), the first left insertion member 251a and the first right insertion member 251b may be arranged only in some areas of the unfolding regions UFR adjacent to the folding region FR (with reference to FIG. 2).

Therefore, the insert 250 according to another embodiment may increase impact resistance in the unfolding regions UFR as well as in the folding region FR compared to the structure of the insert 150 according to one embodiment.

Figure 8A:
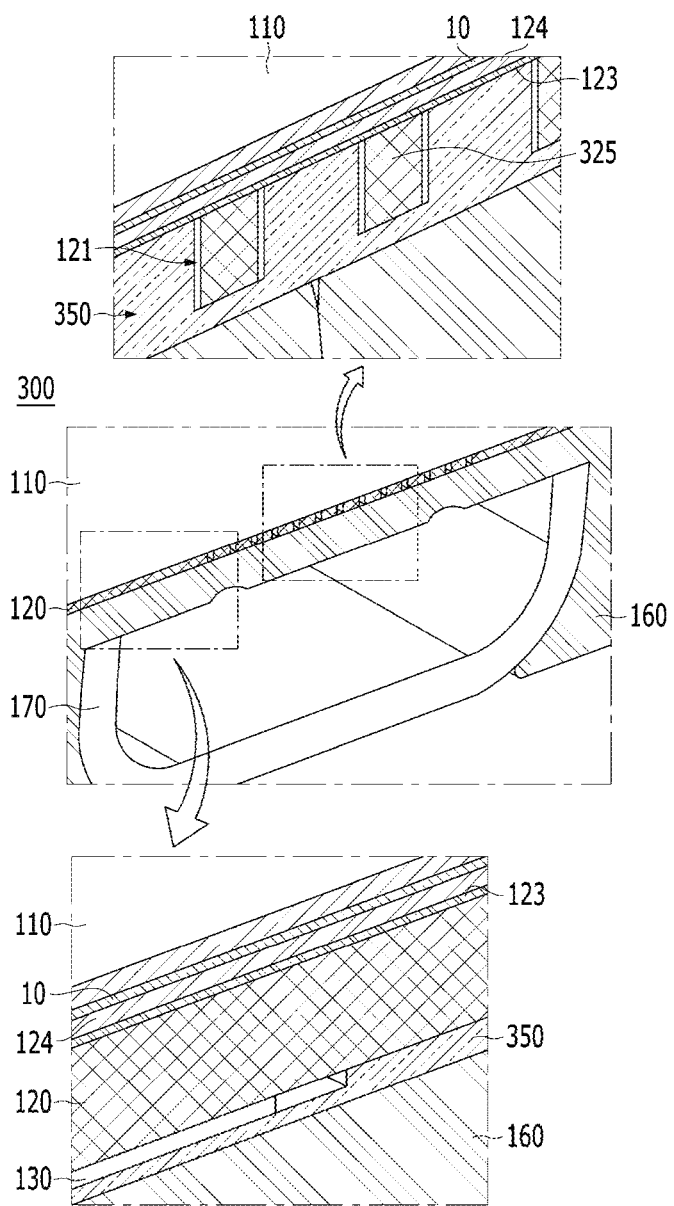
FIG. 8A is a perspective view illustrating yet another embodiment of the insert in the folding region of the foldable display device shown in FIG. 5.
Figure 8B:
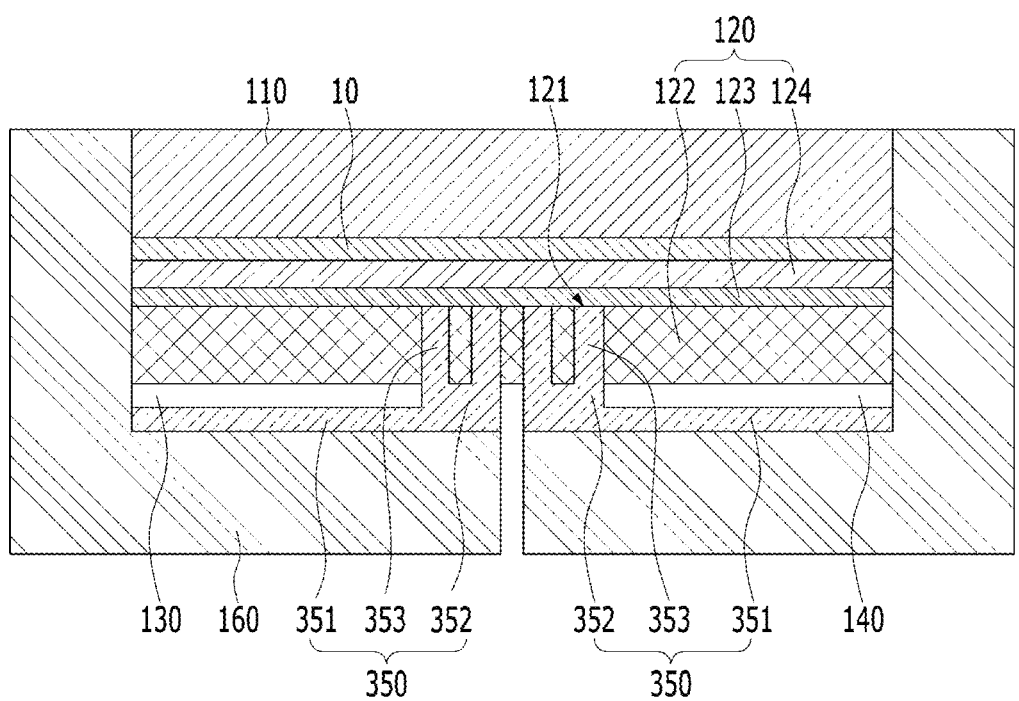
FIG. 8B is a cross-sectional view of the foldable display device shown in FIG. 8A.
Figure 8C:
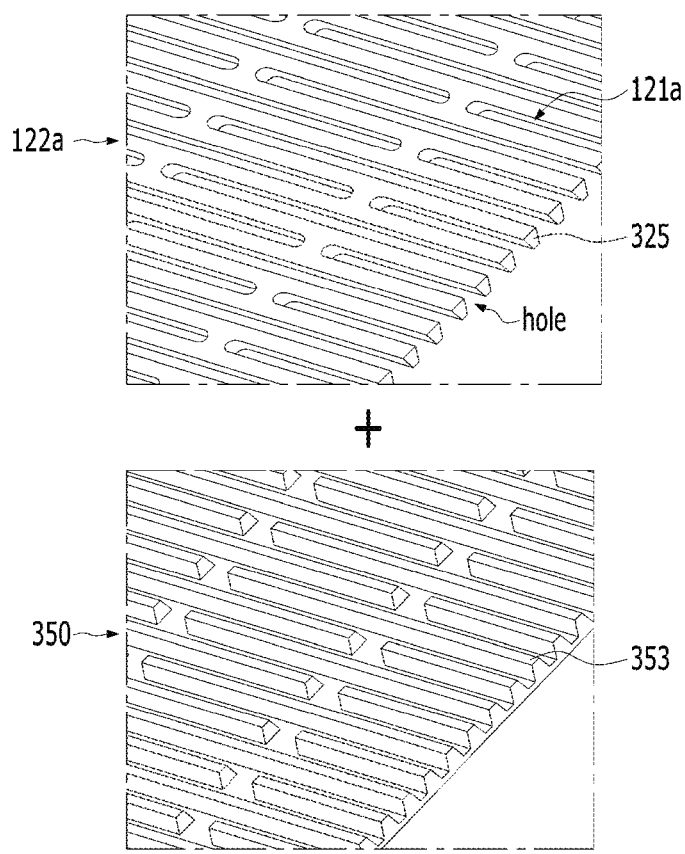
FIG. 8C is a partially enlarged view illustrating the insert shown in FIG. 8A.
Figure 8D:
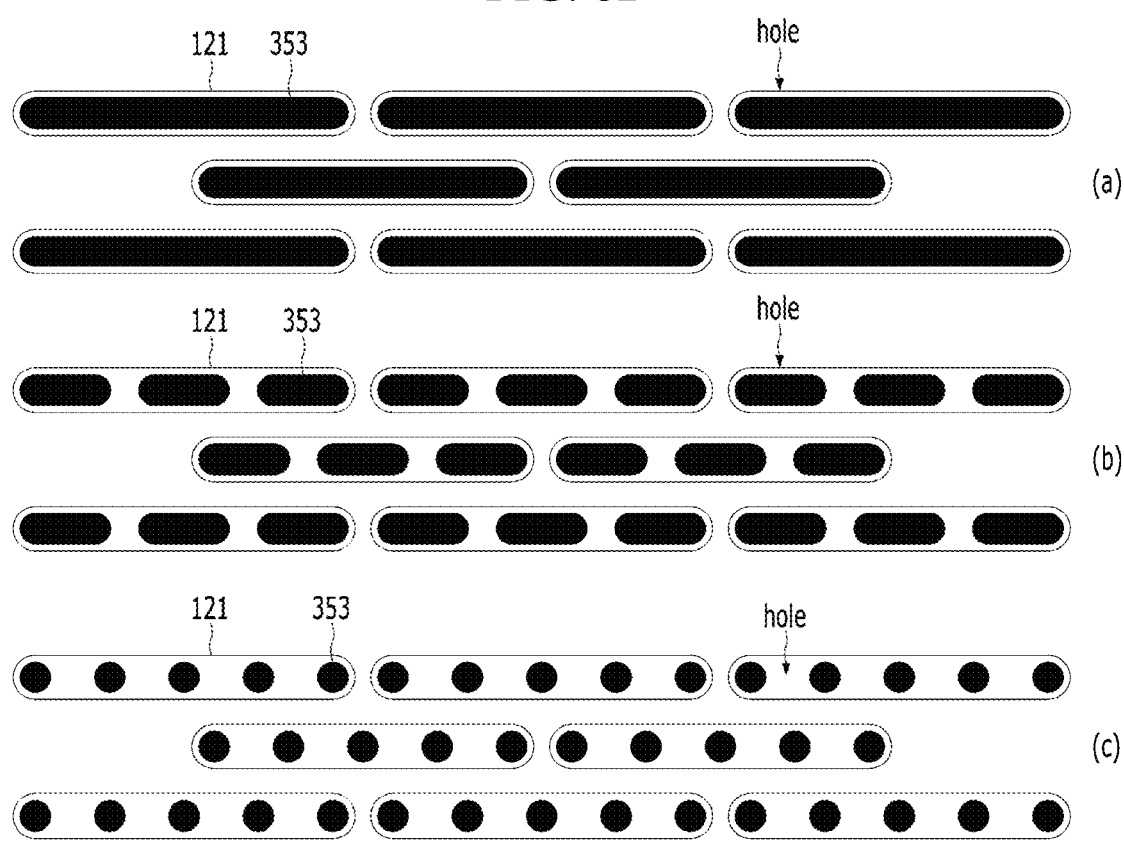
FIG. 8D is a reference view illustrating embodiments of coupling between a first plate and third insertion members shown in FIG. 8C.

FIG. 8A is a perspective view illustrating yet another embodiment of the insert in the folding region of the foldable display device shown in FIG. 5, FIG. 8B is a cross-sectional view of the foldable display device shown in FIG. 8A, FIG. 8C is a partially enlarged view illustrating the insert shown in FIG. 8A, and FIG. 8D is a reference view illustrating embodiments of coupling between a first plate and third insertion members shown in FIG. 8C.

Referring to FIGS. 8A to 8D, in a foldable display device 300 according to yet another embodiment of the present invention, a mid-frame 120 is adhered to the rear surface of a display panel 110 by an adhesive layer 10, and an insert 350 is arranged on the rear surface of the mid-frame 120.

The insert 350 includes first insertion members 351 arranged on the rear surfaces of a first adhesive layer 130 and a second adhesive layer 140, second insertion members 352 arranged between the first adhesive layer 130 and the second adhesive layer 140 on the first insertion members 351, and third insertion members 353 arranged on the second insertion members 352 so as to be inserted into holes of a perforate pattern 121. The structures of the first insertion member 351 and the second insertion member 352 of the insert 350 are the same as those of the first and second left insertion members 251a and 252a and the first and second right insertion members 251b and 252b of the above-described insert 250 according to another embodiment of the present invention, and a detailed description thereof will thus be omitted.

In the insert 350 according to yet another embodiment of the present invention, the first insertion member 351 and the second insertion member 352 may be formed in an integrated structure or a separated structure, in the same manner as the above-described insert 250 according to another embodiment, and the third insertion members 353, added in yet another embodiment, and the second insertion member 352 may be formed in an integrated structure or a separated structure also. For example, in the separated structure, the third insertion members 353 may be coupled to the upper surface of the second insertion member 352 so as to be inserted into the holes of the perforated pattern 121, or the third insertion members 353 may be inserted into the holes of the perforated pattern 121 and then the mid-frame 120 may be coupled to the second insertion members 352 and the adhesive layers 130 and 140.

Here, referring to FIG. 8C, connection frames 325 of a first plate 122a, which connect respective holes of a perforated pattern 121a to adjacent holes, may have a trapezoidal cross-section. Further, the third insertion members 353 inserted into the holes of the perforated pattern 121a may have a trapezoidal cross-section corresponding to the cross-section of the connection frames 325. Of course, the trapezoidal cross-section of the connection frames 325 and the trapezoidal cross-section of the third insertion members 353 may be configured such that the upper sides thereof opposite to each other are short so as not to cause interference therebetween in coupling directions thereof. However, the shape of the cross-section of the connection frames 325 and the third insertion members 353 is not limited thereto. For example, such shape may also be formed as a triangular or higher-order polygonal shape. Further, the ends of the third insertion members 353 may extend up to the rear surface of a third adhesive layer 123.

Further, the third insertion members 353 may have a shape corresponding to the shape of the holes of the perforated pattern 121 so as to fit into the respective holes, shown in (a) of FIG. 8D, or the third insertion members 353 may be sparsely arranged in each of the respective holes so as to form an empty space within the holes of the perforate pattern 121, shown in (b) and (c) of FIG. 8D. For example, the third insertion members 353 may be arranged in a dot pattern in each of the holes of the perforated pattern 121. In the dot pattern of the third insertion members 353, the cross-sections of the third insertion members 353 may have a circular shape, a long hole shape or a polygonal shape, and the third insertion members 353 may be arranged at the same interval in each of the holes of the perforated pattern 121.

The foldable display device according to the present invention includes the insert provided in the folding region between the mid-frame and the back cover so as to eliminate a vacant space in the folding region, thereby being capable of preventing damage to the display panel due to impact applied to the vacant space and preventing occurrence of a sense of difference in touch between the folding region and unfolding regions through the vacant space.

As is apparent from the above description, a foldable display device according to the present invention includes an insert provided in a folding region between a mid-frame and a back cover so as to eliminate a vacant space in the folding region, thereby being capable of preventing damage to a display panel due to impact applied to the vacant space and preventing occurrence of a sense of difference in touch between the folding region and unfolding regions through the vacant space.

It will be apparent to those skilled in the art that various modifications and variations can be made in the foldable display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A foldable display device, comprising:
a display panel;
a mid-frame arranged on a rear surface of the display panel, comprising a folding region and unfolding regions formed at both sides of the folding region;
a first adhesive layer and a second adhesive layer arranged in the respective unfolding regions on a rear surface of the mid-frame; and
an insert arranged corresponding to the folding region on the rear surface of the mid-frame;
wherein the mid-frame comprises:
a first plate configured to have a perforated pattern formed therethrough in the folding region;
a third adhesive layer arranged on an upper surface of the first plate; and
a second plate arranged on an upper surface of the third adhesive layer;
wherein the insert comprises:
first insertion members arranged on rear surfaces of the first adhesive layer and the second adhesive layer; and
second insertion members arranged between the first adhesive layer and the second adhesive layer on the first insertion members;
wherein the insert is divided into two parts by a folding axis.

2. The foldable display device according to claim 1, wherein the insert is arranged between the first adhesive layer and the second adhesive layer.

3. The foldable display device according to claim 2, wherein the insert is formed to have a thickness corresponding to a thickness of the first adhesive layer or the second adhesive layer.

4. The foldable display device according to claim 2, wherein the insert is formed of an elastic material so as to be elastically stretched during a process of folding the mid-frame.

5. The foldable display device according to claim 1, wherein the insert further comprises third insertion members arranged on the second insertion members so as to be inserted into the perforated pattern.

6. The foldable display device according to claim 5, wherein:
the first plate comprises connection frames configured to connect respective holes of the perforated pattern to adjacent holes; and
cross-sections of the third insertion members and the connection frames have a trapezoidal shape or a triangular or higher-order polygonal shape.

7. The foldable display device according to claim 6, wherein the third insertion members have a shape corresponding to that of the holes of the perforated pattern.

8. The foldable display device according to claim 6, wherein the third insertion members are arranged in a dot pattern in each of the holes of the perforated pattern.

9. The foldable display device according to claim 6, wherein the third insertion members extend up to a rear surface of the third adhesive layer.

10. The foldable display device according to claim 1, wherein the two parts of the insert are separated from each other during a process of folding the foldable display device.

11. The foldable display device according to claim 1, further comprising a back cover arranged to surround side and rear surfaces of the foldable display device, coupled to rear surfaces of the first adhesive layer and the second adhesive layer or a rear surface of the insert, and divided into two parts so as to be folded in the folding region.

12. The foldable display device according to claim 1, wherein the third adhesive layer is arranged only in the unfolding regions between the first plate and the second plate.

13. The foldable display device according to claim 1, wherein the third adhesive layer is arranged between the first plate and the second plate, such that the third adhesive layer is adhered to both the first plate and the second plate in the unfolding regions and is adhered to any one of the first plate and the second plate in the folding region.

\* \* \* \* \*